United States Patent [19]
Adamczyk et al.

[11] Patent Number: 5,098,815
[45] Date of Patent: Mar. 24, 1992

[54] PROCESS FOR THE PRODUCTION OF DIELECTRIC LAYERS IN PLANAR CIRCUITS ON CERAMICS SUBSTRATES

[75] Inventors: Andrzej Adamczyk, Dreieich, Fed. Rep. of Germany; William E. Delaney, Hockessin, Del.

[73] Assignee: E. I. Du Pont de Nemours and Company, Wilmington, Del.

[21] Appl. No.: 367,342

[22] Filed: Jun. 16, 1989

[30] Foreign Application Priority Data

Jul. 11, 1988 [DE] Fed. Rep. of Germany ....... 3823463

[51] Int. Cl.$^5$ .............................................. G03C 5/00
[52] U.S. Cl. ..................... 430/315; 430/198; 430/330
[58] Field of Search ............... 430/198, 330, 315

[56] References Cited

U.S. PATENT DOCUMENTS 4,912,022  3/1990  Urquhart et al. ................ 430/396

FOREIGN PATENT DOCUMENTS 135949  7/1985  Japan ................................ 430/4

OTHER PUBLICATIONS

Watanabe et al., "Thick Film Fine Pattern Formation . . . ", Conf: Proceedings 29th Electronic Component Conf., N.J., May 1979.

Primary Examiner—Charles L. Bowers, Jr.
Assistant Examiner—Ashley I. Pezzner

[57] ABSTRACT

Apertures with inclined sidewalls are produced in a dielectric layer by exposing a photoformable dielectric layer through a mask having a section without a sharp line of demarcation between opaque and transparent areas.

3 Claims, 1 Drawing Sheet

PROCESS FOR THE PRODUCTION OF DIELECTRIC LAYERS IN PLANAR CIRCUITS ON CERAMICS SUBSTRATES

BACKGROUND OF THE INVENTION

The invention relates to a process for the production of dielectric layers in planar circuits on ceramic substrates.

Planar circuits on ceramic substrates are known in which several circuit levels are insulated from one another by dielectric layers. These dielectric layers have apertures that serve both to accept permanent conductive connections and for connecting pins to be passed through for connection with other components. Especially apertures of the latter kind situated above corresponding holes in the substrate are advantageously made to be conical, narrowing towards the substrate, so that the dielectric layer is not damaged when the connecting pins are introduced, and a reliable connection is enabled between the connecting pins and the conductors. The known photolithographic processes, in which a paste comprising a photoresist and a powder dielectric material are used, as a rule only yield apertures whose sidewalls, are almost vertical to the circuit level. The screen printing process, in contrast, always yields sidewalls that are more or less sloping, and usually also curved. The shape of these walls depends on a number of process parameters and is difficult to control without affecting other properties of the finished product.

A process for the photolithographic production of apertures in photoresist coats that have sloping sidewalls is known from European Patent 227 851. In this case, after image-wise exposure, the photoresist layer is post-exposed diffusely. The result of this is that the upper areas of the entire layer become at least somewhat soluble. The thickness of the resulting layer can, therefore, not be kept uniform without difficulty. The known process is also only used on pure photoresist layers in the micrometer range and cannot be transferred to layers of photoformable pastes that are more than 20 μm thick.

SUMMARY OF THE INVENTION

The object of the invention is to give a process by which dielectric layers can be produced in planar circuits on ceramic substrates, in which the inclination of the sidewalls of the apertures perforating the layer can be controlled over a wide range, without having to change the materials used or the process parameters that influence the properties of the finished product.

This object is achieved by a process in which the substrate, optionally provided with a conductive pattern, is coated with a positive photoformable dielectric paste. The coating is exposed through a mask that has transparent areas without a sharp line of demarcation with opaque areas at the points or areas at which apertures with inclined sidewalls are to be formed, followed by development and firing after exposure.

The present invention is directed to a process for the production of a dielectric layer in formation of a planar circuit on a ceramic substrate that have apertures with sidewalls inclined at an acute angle to the plane of the substrate, characterized in:

(a) coating the substrate optionally provided with a conductive pattern with a positive photoformable dielectric paste followed by drying of the coating;

(b) exposing the coating to light through a mask that has opaque and transparent areas without a sharp line of demarcation corresponding to areas at which apertures with inclined sidewalls are to be formed, and (c) developing and firing the coating.

DETAILED DESCRIPTION OF THE INVENTION

Suitable photoformable pastes can be produced by mixing a positive photoresist with a dielectric powder material. The grain size of the powder is governed by the resolution required. Suitable photoresists, for example, are commercially available solutions based on quinone diazide novolak. In order to adjust the concentration and viscosity to appropriate values for the coating process, solvents or polymer binders can also be added. Suitable materials are known to those skilled in the art. Pastes with a previously described composition can also be used, e.g., according to East German Patent 234 196 and Soviet Union Patent 1 123 012.

Suitable dielectric materials are chiefly the glasses customarily used in thick-film technology, which are mostly based on lead silicate or borosilicate, optionally mixed with other dielectric substances such as e.g., aluminum oxide.

The exposure mask to carry out the process of the invention is preferably a positive mask, i.e., one that is not transparent at the points at which the dielectric layer is to be formed, whereas the apertures in the layer are represented as transparent areas with a minimum optical density in the mask. These areas have edges which are not sharp in areas corresponding to apertures with slanting sidewalls. Such masks are not known up to now in thick-film technology; on the contrary, greater importance is attached to the transparent areas having edges that are as sharp as possible, i.e, to a sharp change in the optical density as it crosses the line of the edge.

The type of mask and the shape of the apertures formed in the dielectric layer are illustrated in more detail below, on the basis of the Figures.

Figure 1:
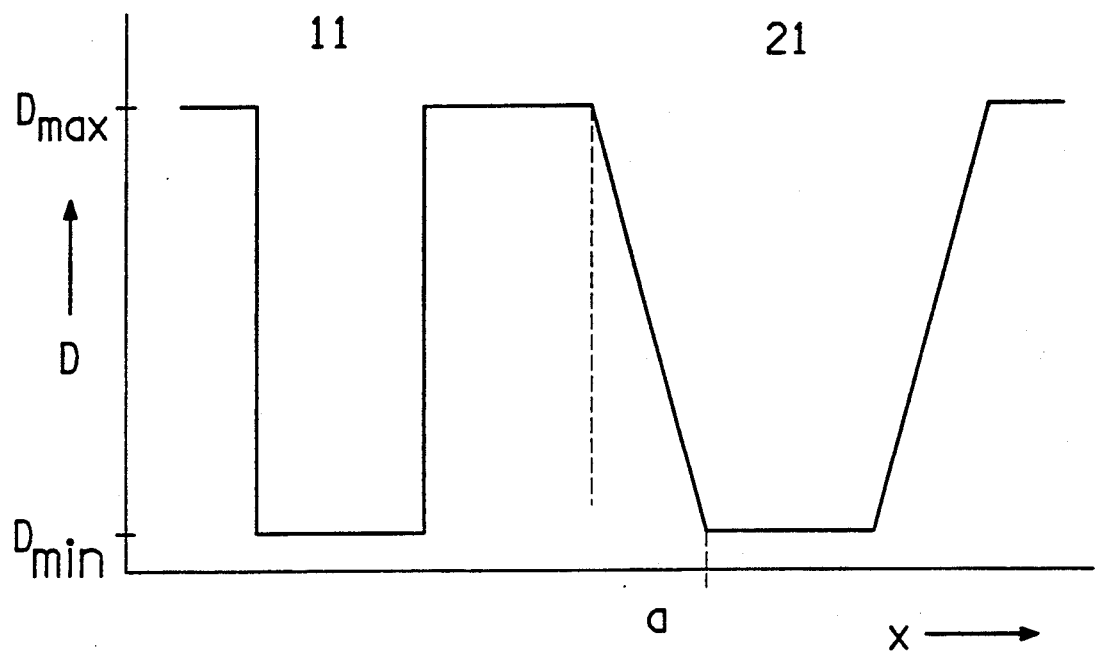
FIG. 1 shows optical density D of a mask along a space coordinate x in the mask plane, as found when sampled with a microdensitometer through a center of a transparent area with a sharp edge and one with an edge which is not sharp.
Figure 2:
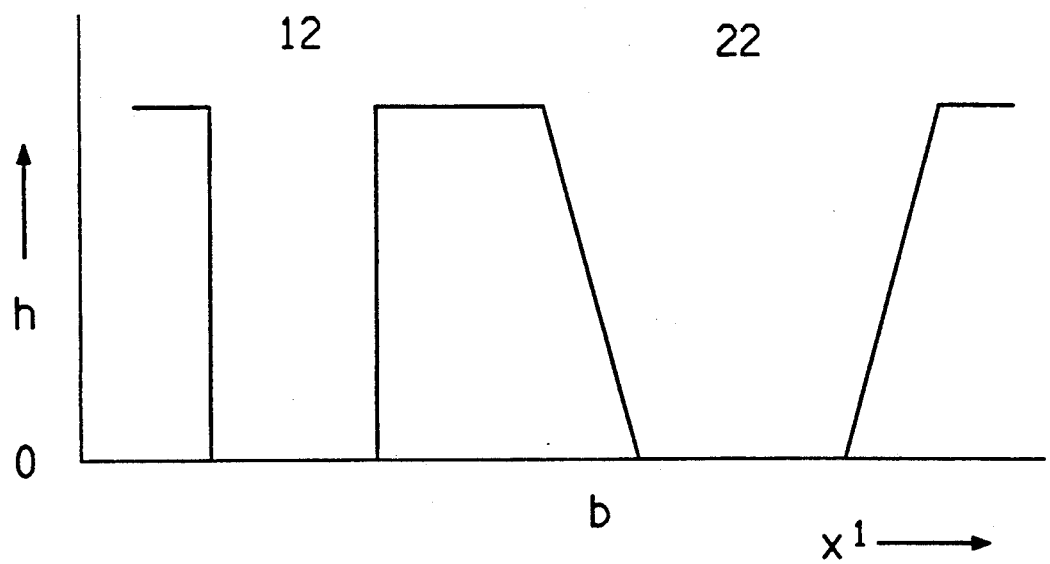
FIG. 2 shows the thickness h of a dielectric layer produced by the mask according to FIG. 1 by means of exposure to light, developing, and firing of a layer of a photoformable paste, over the space coordinates x' formed by orthogonal parallel projection of x onto the substrate plane.

At the points or areas at which the dielectric layer is to be formed on the substrate, the positive mask has a high optical density $D_{max}$. In contrast, the optical density of the transparent areas where apertures are to be formed in the dielectric layer is very low ($D_{min}$). As it enters a transparent area 11 with sharp edges, the optical density changes suddenly, so that the curve in FIG. 1 runs vertically at this point. On entering an area 21 with unsharp edges, in contrast, the change in density is distributed over an interval a of the space coordinates, i.e., the density decreases gradually. The same is true of the increase in density on leaving areas 11 or 21, respectively. As FIG. 2 shows, an aperture 12 with vertical sidewalls is formed in the dielectric layer when the mask has a transparent area 11 with sharp edges. The sidewall of the aperture 22 formed at the site of the area 21 with unsharp edges, in contrast, is inclined at an acute angle to the substrate plane. The projection of the sidewall onto the substrate plane then has a width b in the direction of the space coordinates x. The width b of the sidewalls of the holes formed in the dielectric layer can be controlled by the width a of the unsharp edges. In general, b is different from a, and it is necessary to ascertain the quantitative correlation of these quantities by testing, since it is determined by functions that are sometimes difficult to calculate, such as, for example, the sensitivity curve of the photoformable paste or the shrinkage characteristic of the dielectric material when fired.

A suitable positive mask can be produced, for example, by copying a sharp negative mask that is transparent where apertures are to be formed, onto a negative halftone film at a short distance from a nonpoint light source. If the dielectric layer is also to contain apertures with vertical sidewalls, a corresponding negative mask in direct contact can be copied simultaneously. A positive mask is then obtained that has transparent areas with both sharp and unsharp edges, and that can be copied onto the photoformable layer. It is also possible, however, to copy a sharp and an unsharp positive mask onto the photoformable layer successively.

According to the process of the invention, dielectric layers with apertures whose sidewalls can be both vertical to the substrate plane and slanted over a wide range of angles can be produced in one operation and with only one photoformable paste.

The invention can be used in particular in the production of hybrid circuits on ceramic substrates in which the dimensions of the structural elements are between about 10 and 100 $\mu$m.

To further illustrate the present invention the following example is provided.

EXAMPLE 24 g of a quinone diazide novolak photoresist coating composition with 17% solids (Shipley 1350) were mixed with 4 mL of beta-terpineol, 7.25 g of glass frit, and 5 g of aluminum oxide, and were ground for 16 hr in a ball mill. Then the solvent was evaporated off until the viscosity had risen to about 10 Pa.s. A 30 $\mu$m-thick coating of this paste was produced on an aluminum oxide support, by screen printing and subsequent drying at 60° C. In order to produce the apertures in the dielectric layer, a positive mask with a maximum density of about 3 and a minimum density of less than 0.1 was produced, which had circular transparent areas 0.5 mm in diameter. The edges of some of these areas was sharp, i.e., when sampled with a microdensitometer a rise in density was observed over a range of less than 5 $\mu$m from minimum to maximum value. Other areas contained edges which were not sharp. The density rose gradually over an interval a from 45 or 72 $\mu$m, respectively. The mask was copied onto the photoformable layer with a high-pressure mercury lamp in contact at an exposure of 150 mJ/cm$^2$. Then the layer was developed with 0.1N sodium hydroxide solution under brushing, and after drying, was fired at 850° C. A dielectric layer 20 $\mu$m in thickness was obtained. When tested with a scanning electron microscope (viewing direction vertical to the substrate plane), both apertures with vertical sidewalls and apertures in which a projection of the sidewall onto the substrate plane had a width b of 20 or 33 $\mu$m, respectively, were observed.

What is claimed is:

1. A process for the production of a dielectric layer in formation of a planer circuit on a ceramic substrate that have apertures with sidewalls inclined at an acute angle to the plane of the substrate, characterized in:
   (a) coating the substrate with a positive photoformable dielectric paste followed by drying of the coating;
   (b) exposing the coating to light through a mask that has opaque and transparent areas without a sharp line of demarcation corresponding to areas at which apertures with inclined sidewalls are to be formed, and
   (c) developing and firing the coating.

2. A process according to claim 1, characterized in that the photoformable dielectric paste contains a dielectric material in the form of powder and a positive photoresist.

3. The process of claim 1 wherein the substrate is provided with a conductive pattern prior to said coating.

* * * * *